United States Patent
Cao

(10) Patent No.: US 8,835,308 B2
(45) Date of Patent: Sep. 16, 2014

(54) METHODS FOR DEPOSITING MATERIALS IN HIGH ASPECT RATIO FEATURES

(75) Inventor: Zhitao Cao, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 180 days.

(21) Appl. No.: 13/307,200

(22) Filed: Nov. 30, 2011

(65) Prior Publication Data

US 2012/0156872 A1 Jun. 21, 2012

Related U.S. Application Data

(60) Provisional application No. 61/425,566, filed on Dec. 21, 2010.

(51) Int. Cl.
- *H01L 21/4763* (2006.01)
- *H01L 21/768* (2006.01)
- *H01L 23/532* (2006.01)

(52) U.S. Cl.
CPC .... *H01L 23/53238* (2013.01); *H01L 21/76877* (2013.01); *H01L 21/76898* (2013.01); *H01L 21/76873* (2013.01); *H01L 21/76843* (2013.01)
USPC ........................................................ 438/643

(58) Field of Classification Search
None
See application file for complete search history.

(56) References Cited

U.S. PATENT DOCUMENTS

| | | | |
|---|---|---|---|
| 6,284,652 B1 * | 9/2001 | Charneski et al. | 438/653 |
| 7,517,798 B2 * | 4/2009 | Tuttle | 438/667 |
| 2003/0034251 A1 * | 2/2003 | Chikarmane et al. | 205/125 |
| 2003/0073304 A1 * | 4/2003 | Mak et al. | 438/643 |
| 2003/0082307 A1 * | 5/2003 | Chung et al. | 427/402 |
| 2004/0101667 A1 * | 5/2004 | O'Loughlin et al. | 428/209 |
| 2007/0117348 A1 * | 5/2007 | Ramanathan et al. | 438/455 |
| 2007/0249163 A1 * | 10/2007 | Oikawa | 438/637 |
| 2008/0254617 A1 * | 10/2008 | Adetutu et al. | 438/643 |
| 2009/0045514 A1 * | 2/2009 | Ishizaka et al. | 257/751 |

* cited by examiner

*Primary Examiner* — Scott B Geyer

(74) *Attorney, Agent, or Firm* — Moser Taboada; Alan Taboada

(57) ABSTRACT

Methods for depositing materials in high aspect ratio features are disclosed herein. In some embodiments, a method of processing a substrate may include providing a substrate having an opening formed in a first surface of the substrate and extending into the substrate towards an opposing second surface of the substrate, the opening having an aspect ratio of height to width of at least 3:1, forming a barrier layer atop the first surface of the substrate and along sidewalls and a bottom surface of the opening, the barrier layer having a first thickness atop the first surface of the substrate, and forming a seed layer atop the barrier layer, wherein a ratio of the second thickness to the first thickness ranges from about 2:1 to about 5:1.

15 Claims, 4 Drawing Sheets

METHODS FOR DEPOSITING MATERIALS IN HIGH ASPECT RATIO FEATURES

CROSS-REFERENCE TO RELATED APPLICATIONS

This application claims benefit of U.S. provisional patent application Ser. No. 61/425,566, filed Dec. 21, 2010, which is herein incorporated by reference.

FIELD

Embodiments of the present invention generally relate to methods of processing substrates having high aspect ratio features.

BACKGROUND

Through silicon via (TSV) or similar technologies require a continuous metal-containing layer to be deposited within a high aspect ratio feature on a substrate. For example, a metal-containing layer to be deposited may be a seed layer which may be used as a template for filling the feature by electroplating or a similar plating technique. A barrier layer to prevent diffusion of dissimilar materials between the feature and the substrate may be deposited preceding the seed layer. Typically, conventional methods require the deposition of a thick seed layer to achieve a sufficient current path for electroplating during the filling of the feature. Unfortunately, the deposition of a thick seed layer is a time consuming and expensive process.

Accordingly, the inventor has provided improved methods for depositing materials in high aspect ratio features.

SUMMARY

Methods for depositing materials in high aspect ratio features are disclosed herein. In some embodiments, a method of processing a substrate may include providing a substrate having an opening formed in a first surface of the substrate and extending into the substrate towards an opposing second surface of the substrate, the opening having an aspect ratio of height to width of at least 3:1, forming a barrier layer atop the first surface of the substrate and along sidewalls and a bottom surface of the opening, the barrier layer having a first thickness atop the first surface of the substrate, and forming a seed layer atop the barrier layer, wherein a ratio of the second thickness to the first thickness ranges from about 2:1 to about 5:1. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
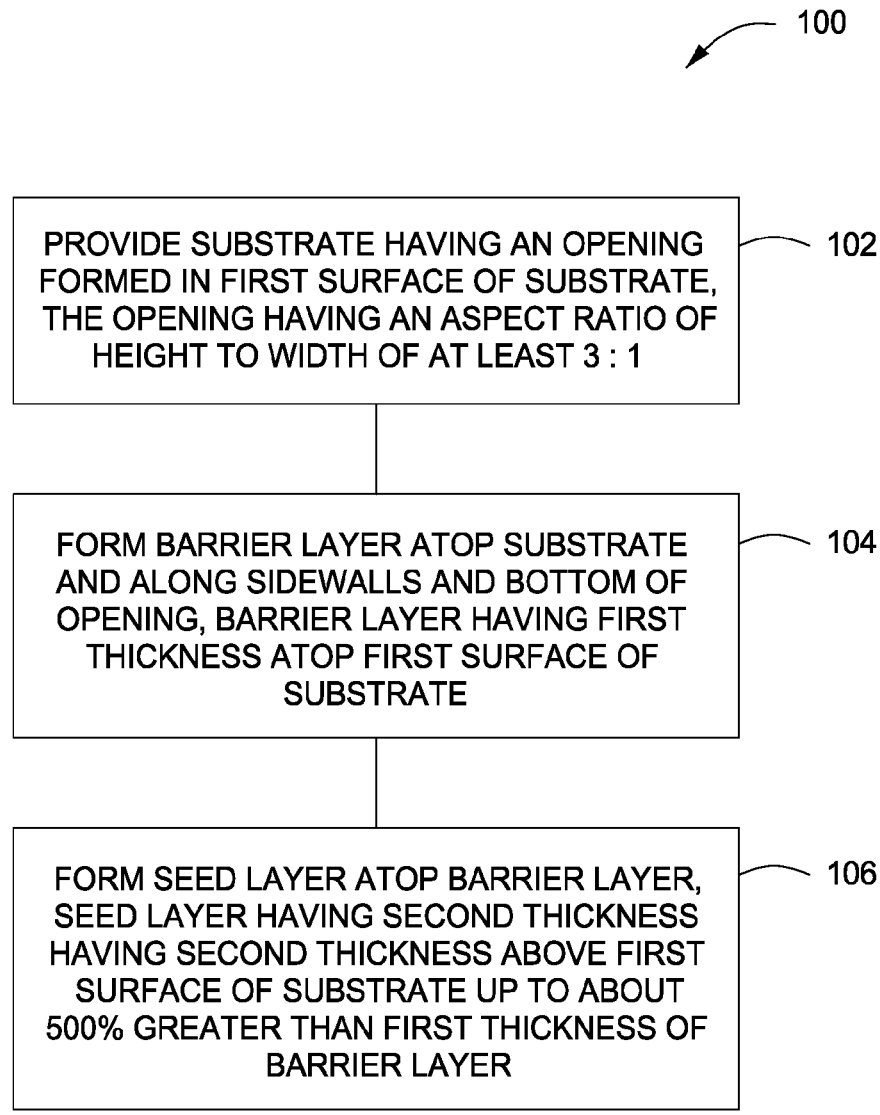
FIG. 1 depicts a flow chart of a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing materials in high aspect ratio features are disclosed herein. The inventive methods may advantageously provide techniques for depositing a relatively thin seed layer (as compared to conventional processes) while maintaining a sufficient current path to fill the high aspect ratio feature with a conductive material via an electroplating process. The inventive methods may achieve significant cost saving for barrier/seed processes by reducing the thickness of the seed layer as much as 80 percent as compared to conventional processed (e.g., from about 1 micron ($\mu$m) to about 200 nanometers (nm)).

FIG. 1 depicts a flow chart of a method 100 for processing a substrate in accordance with some embodiments of the present invention. The method 100 is described below with respect to the stages of filling a high aspect ratio feature as depicted in FIG. 2. The method 100 may be performed in any suitable PVD process chambers, for example, such as the process chamber described below with respect to FIG. 3.

Figure 2A:
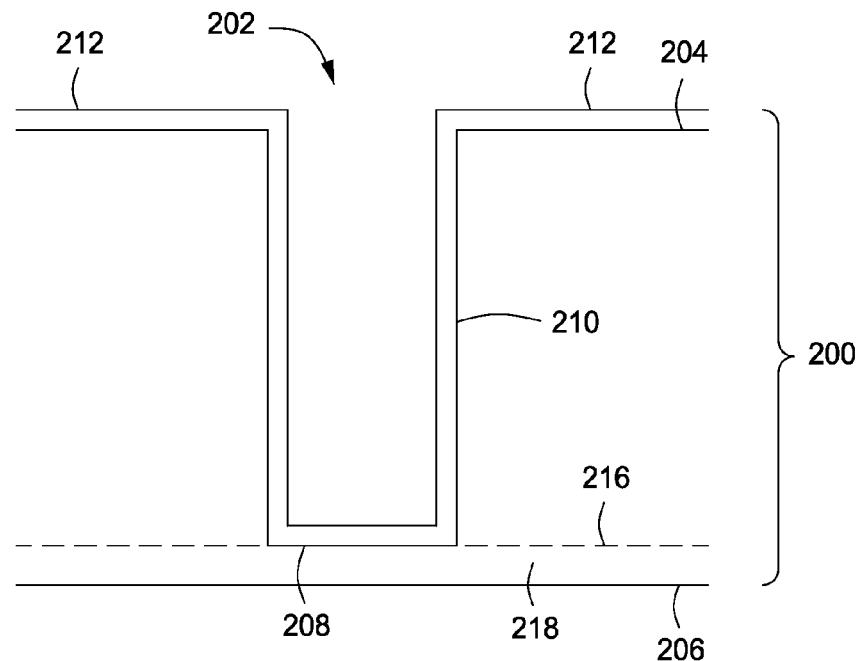
FIGS. 2A-D depict the stages of filling a high aspect ratio opening in accordance with some embodiments of the present invention.
Figure 3:
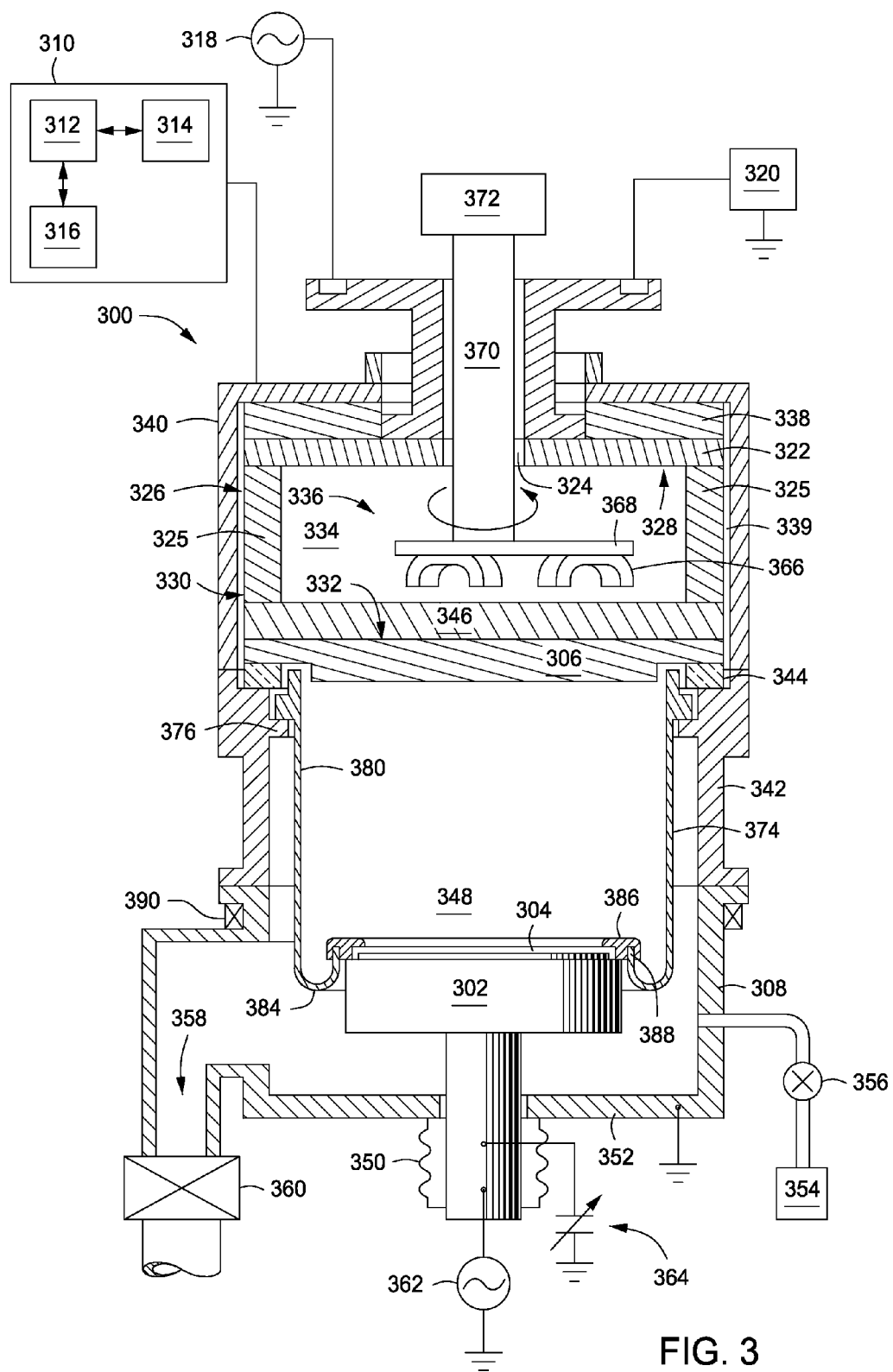
FIG. 3 depicts a schematic, cross-sectional view of physical vapor deposition (PVD) chamber in accordance with some embodiments of the present invention.

The method 100 generally begins at 102 by providing a substrate 200 to a PVD chamber, for example the process chamber 300 depicted in FIG. 3. As shown in FIG. 2A, the substrate 200 includes a high aspect ratio opening 202 formed in a first surface 204 of the substrate 200 and extending into the substrate 200 towards an opposing second surface 206 of the substrate 200. The substrate 200 may be any suitable substrate having a high aspect ratio opening formed thereon. For example, the substrate 200 may comprise one or more of silicon (Si), an oxide, a nitride, or the like. In addition, the substrate 200 may include additional layers of materials or may have one or more completed or partially completed structures formed therein or thereon.

The opening may be any opening having a high aspect ratio, such as used to form a via, trench, dual damascene structure, or the like. The opening 202 may have a height to width aspect ratio of about 3:1 to about 7:1, or at least about 5:1 (e.g., a high aspect ratio). In some embodiments, the aspect ratio may be about 10:1 or greater, such as about 20:1, or more. In some embodiments, the aspect ratio may fall between these values (e.g., from about 7:1 to about 10:1). In some embodiments, the opening may have an illustrative height of about 50 $\mu$m and an illustrative width of about 5 $\mu$m, although other dimensions may be used. The opening 202 may be formed by etching the substrate using any suitable etch process. The opening 202 includes a bottom surface 208 and sidewalls 210 as shown.

In some embodiments, the bottom surface 208 and the sidewalls 210 may be covered with one or more layers prior to depositing a seed layer as described below. For example, and as shown in FIG. 2A, the bottom surface and sidewalls of the opening 202 and the first surface of the substrate 200 may be covered by an oxide layer 212, such as silicon oxide ($SiO_2$), or the like. Alternatively, or in combination, a layer(s) (not shown) include one or more silicon nitride (SiN), silicon (Si) or the like may also be included atop the surfaces of the substrate 200 and/or the surfaces of the opening 202. The oxide layer may be deposited or grown, for example in a chemical vapor deposition (CVD) chamber or in a oxidation chamber, prior to providing the substrate 200 to a PVD chamber. The oxide layer 212 may serve as an electrical and/or physical barrier between the substrate and a metal-containing layer to be subsequently deposited in the opening, and/or may function as a better surface for attachment during the deposition process discussed below than a native surface of the substrate.

In some embodiments, and as illustrated in phantom in FIG. 2A, the opening 202 may extend completely through the substrate 200 and a surface 216 of a second substrate 218 may form the bottom surface 208 of the opening 202. The second substrate 218 may be disposed adjacent to the second surface 206 of the substrate 200 (in which case the second surface 206 would be located above the dashed line representing the surface 216 in FIG. 2A). Further (as shown in FIG. 2F and discussed below), a device, such as a logic device or the like, or a portion of a device requiring electrical connectivity, such as a gate, a contact pad, a conductive via, or the like, may be disposed in the surface 216 of the second substrate 218 and aligned with the opening 202.

Figure 2B:
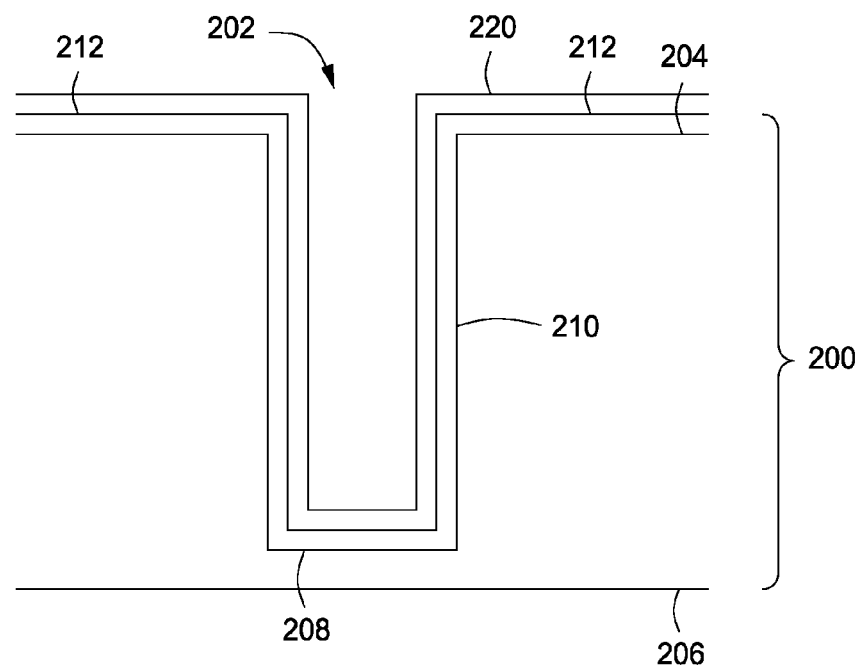

At 104, a barrier layer 220 is formed atop the first surface 204 of the substrate 200 and along the sidewalls 210 and the bottom surface 208 of the opening 202, as illustrated in FIG. 2B. The barrier layer may be formed to a first thickness atop the first surface 204 of the substrate 200, where the first thickness may be considered a field thickness or a large scale average thickness which predominantly covers the first surface 204 of the substrate 200. The first thickness may range from about 500 to about 4000 angstroms depending on the aspect ratio of the opening. For example, in some embodiments where the aspect ratio of the opening 202 is from about 3:1 to about 7:1, or about 5:1, the barrier layer 220 may have a first thickness of up to about 1000 angstroms, or from about 500 to about 1000 angstroms, or about 1000 angstroms. In some embodiments where the aspect ratio ranges from about 10:1 to about 20:1, the barrier layer 220 may have a first thickness of up to about 4000 angstroms, or from about 2000 to about 4000 angstroms, or about 2000 angstroms. In embodiments where the aspect ratio ranges from about 7:1 to about 10:1, the barrier layer 220 may have a first thickness that scales between the aforementioned values, for example, from about 1000 to about 4000 angstroms. In some embodiments, the barrier layer 220 may be deposited atop the oxide layer 212 (as shown in FIG. 2B) or alternatively, deposited atop the bottom surface 208 and sidewalls 210 of the opening and the first surface 204 of the substrate. In some embodiments, the barrier layer 220 may include at least one of titanium (Ti) or tantalum (Ta). The increased thickness of the barrier layer 220 relative to a seed layer 222 (discussed below) disclosed in the inventive methods herein may be used to maintain a sufficient current path for electroplating or a similar technique used to fill of the opening 202 (as discussed below). The barrier layer 220 may be deposited by any suitable technique, such as by physical vapor deposition (PVD).

During the deposition of the barrier layer 220 to the first thickness atop the first surface 204 of the substrate 200, the barrier layer 220 forms on the sidewalls 210 and bottom surface 208 of the opening 202 as discussed above. The thickness of the barrier layer 220 formed on the sidewalls 210 and bottom surface 208 may be less than the first thickness of the barrier layer 220 formed atop the first surface 204 of the substrate 200. The ratio of the lesser thickness of the barrier layer 220 disposed on the sidewalls 210 and the bottom surface 208 to the field thickness of the barrier layer 220 may be referred to as the step coverage of the deposited barrier layer. In some embodiments, the step coverage of the barrier layer 220 deposited atop the bottom surface 208 may range from about 4 to about 50 percent of the first thickness of the barrier layer 220 deposited atop the first surface 204 of the substrate 200, depending upon the aspect ratio of the opening 202. For example, in some embodiments, where the aspect ratio is from about 3:1 to about 7:1, the step coverage of the barrier layer may be about 10 to about 50 percent. In some embodiments, where the aspect ratio is from about 10:1 to about 20:1, the step coverage of the barrier layer may be about 4 to about 15 percent. In embodiments where the aspect ratio ranges from about 7:1 to about 10:1, the step coverage of the barrier layer may scale between the aforementioned values.

Figure 2C:
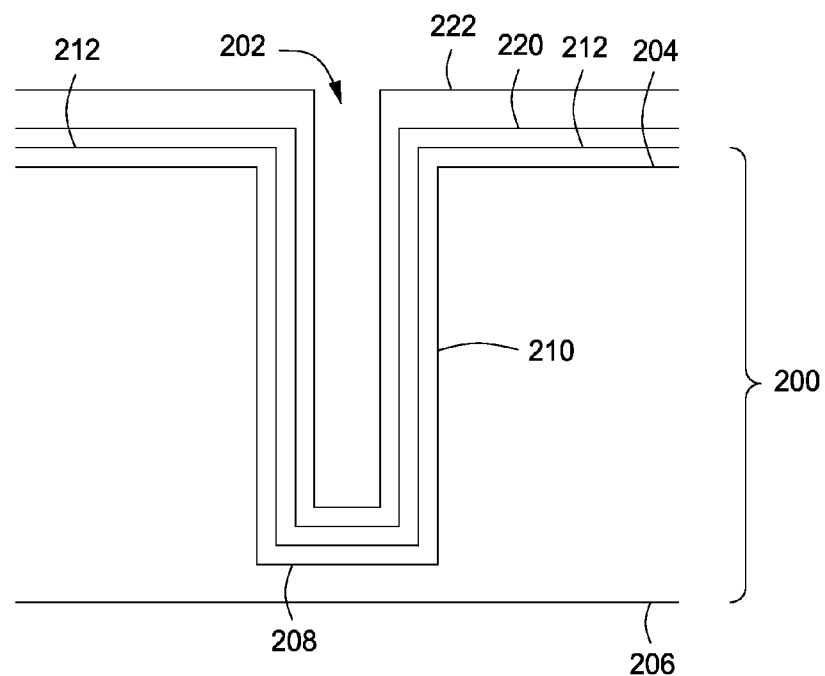

At 106, a seed layer 222 is formed atop the barrier layer 220 to a second thickness above the upper surface of the substrate, as illustrated in FIG. 2C. A ratio of the thickness of the seed layer (the second thickness) to the thickness of the barrier layer (the first thickness) may be about 2:1 to about 5:1. The ratio of the thickness of seed layer to the thickness of the barrier layer is reduced as compared to conventional processes, which may deposit a seed layer that is up to 10 times as thick as the barrier layer. The second thickness of the seed layer, similar to the first thickness of the barrier layer 220, may be discussed in terms of a field thickness or a large scale average thickness which predominantly covers the barrier layer 220 disposed on the first surface 204 of the substrate 200. Further, similar to the barrier layer 220 as discussed above, the second thickness of the seed layer 222 above the upper surface 204 may be greater than a thickness of the seed layer 222 formed atop the barrier layer 220 on the sidewalls 210 and the bottom surface 208 of the opening 202.

For example, in some embodiments where the aspect ratio of the opening 202 is about 3:1 to about 7:1, or about 5:1, the seed layer 222 may have a second thickness of up to about 5000 angstroms, or ranging from about 1000 to about 5000 angstroms, or about 2000 angstroms in thickness. In some embodiments where the aspect ratio ranges from about 10:1 to about 20:1, the seed layer 222 may have a second thickness of up to about 20000 Angstroms, or ranging from about 4000 angstroms to about 20000 angstroms. In embodiments where the aspect ratio ranges from about 7:1 to about 10:1, the seed layer 222 may have a second thickness that scales between the aforementioned values. In some embodiments, the seed layer 222 may comprise Copper (Cu). The seed layer 222 may be deposited by any suitable technique, such as by physical vapor deposition (PVD).

As discussed above, the thickness of the seed layer 222 formed atop the barrier layer 220 on the sidewalls 210 and the bottom surface 208 may be less than the second thickness of the seed layer 222 formed atop the barrier layer 220 on the first surface 204 of the substrate 200. In some embodiments, the step coverage of the seed layer 222 deposited atop the barrier layer 220 on the bottom surface 208 may range from about 3 to about 35 percent of the second thickness of the seed layer 222 deposited atop the barrier layer 220 on the first surface 204 of the substrate 200, depending upon the aspect ratio of the opening 202. For example, in some embodiments, where the aspect ratio is from about 3:1 to about 7:1, the step coverage of the seed layer may be about 8 to about 35 percent. In some embodiments, where the aspect ratio is from about 10:1 to about 20:1, the step coverage of the barrier layer may be about 3 to about 10 percent. In embodiments where the aspect ratio ranges from about 7:1 to about 10:1, the step coverage of the seed layer may scale between the aforementioned values.

Figure 2D:
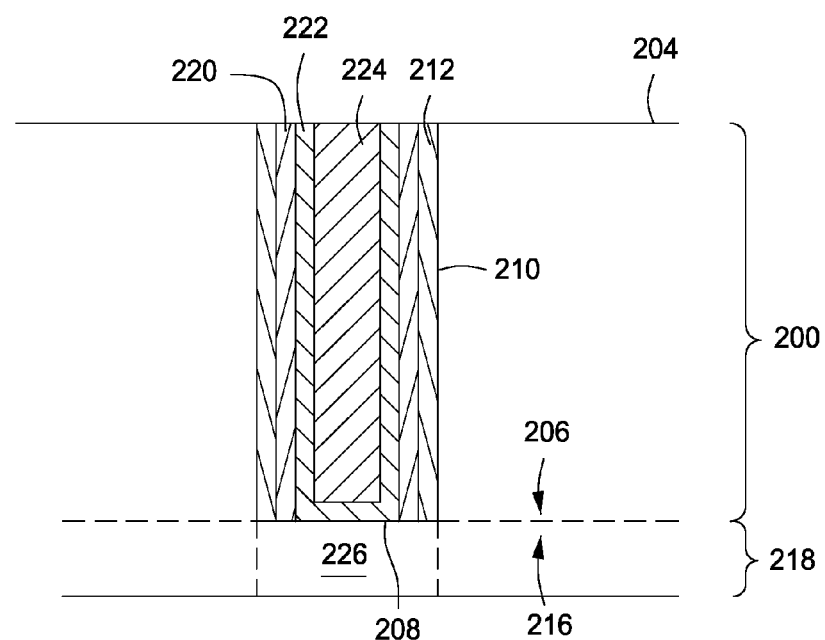

After the seed layer 222 is formed at 106, the method 100 may proceed by depositing a material 224 atop the seed layer 222 to fill the opening 202, as shown at 110 and as depicted in FIG. 2D. The material 224 may be deposited by electroplating or a similar processing technique. The material 224 may include metals, metal alloys, or the like. In some embodiments, the material may comprise copper (Cu), or the like. In some embodiments, the deposited material 224 and the seed layer 222 are the same material. In some embodiments, the deposited material 224 and the seed layer 222 are different materials.

In some embodiments, and as discussed above with respect to FIG. 2A, the second substrate 218 may have been provided prior to performing 104-106 described above. Accordingly, as illustrated in FIG. 2D, the second substrate 218 may be disposed adjacent to the second surface 206 of the substrate 200, where the opening 202 extends completely through the substrate 200 and the surface 216 of the second substrate 218 forms the bottom surface of the opening 202. Further, a device or conductive feature 226 may be disposed in the second substrate and exposed at the surface 216, wherein the device or conductive feature 226 is aligned with the opening 202. The first surface 204 of the substrate 200 may be further processed to remove deposited metal atoms. For example, a chemical mechanical polishing technique, etching, or the like may be used to remove deposited metal atoms from the first surface 204, as illustrated in FIG. 2D.

In some embodiments, after the material 224 has been deposited as described above, material may be removed from the second surface 206 of the substrate 200 to expose at least one the first layer 230 or the deposited material 224 (the first layer 230 is illustrated as being exposed in FIG. 2D). The removal of material from the second surface 206 may be performed by chemical mechanical polishing or similar techniques as described above for the removal of deposited metal from the first surface 204 of the substrate 200.

After the removal of material from the second surface 206 to expose at least one the first layer 230 or the deposited material 224, the second surface 206 of the substrate 200 may be coupled to the surface 216 of the second substrate 218. In some embodiments, the device or conductive feature 226 exposed at the surface 216 of the second substrate 218 may be aligned with the opening 202 in the substrate 200.

FIG. 3 depicts a schematic, cross-sectional view of a physical vapor deposition chamber (process chamber 300) in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded enclosure wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening of the body via the hole 324 of the source distribution plate 322. The cavity 334 and the central opening of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground shield 340 may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 358 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the chamber 300 and the substrate 304. A motor 372 can be coupled to the upper end of the rotation shaft 370 to drive rotation of the magnetron assembly 336. The magnets 366 produce a magnetic field within the chamber 300, generally parallel and close to the surface of the target 306 to trap electrons and increase the local plasma density, which in turn increases the sputtering rate. The magnets 366 produce an electromagnetic field around the top of the chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the chamber 300 may further include a process kit shield 374 connected to a ledge 376 of the adapter 342 and having an inner surface 380 that faces the center of the chamber 300. The adapter 342 in turn is sealed and grounded to the aluminum chamber sidewall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present invention.

In some embodiments, a magnet 390 may be disposed about the chamber 200 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

Thus, methods for depositing materials in high aspect ratio features have been disclosed herein. The inventive methods advantageously provide techniques for depositing a relatively thin seed layer (as compared to conventional processes) while maintaining a sufficient current path to fill the high aspect ratio feature with a conductive material via an electroplating process. The inventive methods achieve significant cost savings for barrier/seed processes by reducing the thickness of the seed layer as much as 80 percent as compared to conventional processes (e.g., from about 1 micron (μm) to about 200 nanometers (nm)).

While the foregoing is directed to embodiments of the present invention, other and further embodiments of the invention may be devised without departing from the basic scope thereof.

The invention claimed is:

1. A method of processing a substrate, comprising:
   providing a substrate having an opening formed in a first surface of the substrate and extending into the substrate towards an opposing second surface of the substrate, the opening having an aspect ratio of height to width of about 10:1 to about 15:1,
   forming a barrier layer atop the first surface of the substrate and along sidewalls and a bottom surface of the opening, the barrier layer having a first thickness atop the first surface of the substrate, wherein the first thickness ranges from about 2000 to about 4000 angstroms; and
   forming a seed layer atop the barrier layer, the seed layer having a second thickness above the first surface of the substrate, wherein the second thickness ranges from about 4000 to about 20000 angstroms.

2. The method of claim 1, wherein the first thickness of the barrier layer is about 2000 angstroms and the second thickness of the seed layer ranges from about 4000 angstroms to about 8000 angstroms.

3. The method of claim 1, wherein providing the substrate further comprises:
   etching the substrate to form the opening in the substrate; and
   forming an oxide layer atop the first surface of the substrate and along the sidewalls and the bottom surface of the opening prior to forming the barrier layer.

4. The method of claim 3, further comprising:
   depositing a material atop the seed layer to fill the opening.

5. The method of claim 4, wherein the material is deposited by an electroplating process.

6. The method of claim 4, wherein the deposited material and the seed layer are the same material.

7. The method of claim 4, further comprising:
   removing the bottom surface of the opening to expose at least one of the first layer or the deposited material.

8. The method of claim 7, wherein removing the bottom surface of the opening further comprises:
   at least partially removing the second surface of the substrate by chemical mechanical polishing to remove the bottom surface of the opening.

9. The method of claim 8, further comprising:
   coupling the second surface of the substrate to an upper surface of a second substrate.

10. The method of claim 9, wherein coupling the second surface of the substrate further comprises:
    aligning the opening with a corresponding device disposed in the upper surface of the second substrate.

11. The method of claim 1, wherein the barrier layer and the seed layer are formed by physical vapor deposition.

12. The method of claim 1, wherein the barrier layer comprises titanium.

13. The method of claim 1, wherein the seed layer comprises copper.

14. A method of processing a substrate:
   providing a substrate having an opening formed in a first surface of the substrate and extending into the substrate towards an opposing second surface of the substrate, the opening having an aspect ratio of height to width of about 3:1 to about 7:1;
   forming a barrier layer atop the first surface of the substrate and along sidewalls and a bottom surface of the opening, the barrier layer having a first thickness atop the first surface of the substrate, wherein the first thickness of the barrier layer is about 1000 angstroms; and
   forming a seed layer atop the barrier layer, the seed layer having a second thickness above the first surface of the substrate, wherein the second thickness of the seed layer is about 2000 angstroms.

15. A method of processing a substrate, comprising:
   providing a substrate having an opening formed in a first surface of the substrate and extending into the substrate towards an opposing second surface of the substrate, the opening having an aspect ratio of height to width of at least 3:1, wherein providing the substrate further comprises etching the substrate to form the opening in the substrate and forming an oxide layer atop the first surface of the substrate and along the sidewalls and the bottom surface of the opening prior to forming the barrier layer;
   forming a barrier layer atop the first surface of the substrate and along sidewalls and a bottom surface of the opening, the barrier layer having a first thickness atop the first surface of the substrate;
   forming a seed layer atop the barrier layer, the seed layer having a second thickness above the first surface of the substrate, wherein a ratio of the second thickness to the first thickness ranges from about 2:1 to about 5:1; and depositing a material atop the seed layer to fill the opening, wherein the substrate is a first substrate and further comprising:

providing a second substrate disposed adjacent to the second surface of the first substrate, wherein the opening extends completely through the first substrate and an upper surface of the second substrate forms the bottom of the opening.

* * * * *